United States Patent [19]

Kim et al.

[11] Patent Number: 5,593,803
[45] Date of Patent: Jan. 14, 1997

[54] PROCESS FOR APPLYING IMAGES TO NON-ADHESIVE SURFACES IN THERMAL DYE TRANSFER IMAGING

[75] Inventors: Choon-Woo Kim, Dongchoon-dong, Rep. of Korea; Hsin-hsin Chou, Woodbury, Minn.

[73] Assignee: Minnesota Mining and Manufacturing Company, St. Paul, Minn.

[21] Appl. No.: 510,970

[22] Filed: Aug. 3, 1995

[51] Int. Cl.$^6$ .............................. G03C 8/10; G03C 8/26; G03F 7/34

[52] U.S. Cl. ..................... 430/22; 430/200; 430/201; 430/952; 503/227

[58] Field of Search ................... 430/200, 201, 430/952, 22; 503/227

[56] References Cited

U.S. PATENT DOCUMENTS

| | | | |
|---|---|---|---|
| 4,500,919 | 2/1985 | Schreiber | 358/78 |
| 4,569,577 | 2/1986 | Spencer | 352/87 |
| 4,623,973 | 11/1986 | Hoffrichter et al. | 364/526 |
| 4,704,615 | 11/1987 | Tanaka | 346/76 PH |
| 5,183,798 | 2/1993 | Sarraf et al. | 430/201 |
| 5,225,392 | 7/1993 | Chang et al. | 430/201 |
| 5,232,817 | 8/1993 | Kawakami et al. | 430/201 |
| 5,256,506 | 10/1993 | Ellis et al. | 430/201 |
| 5,278,023 | 1/1994 | Bills et al. | 430/201 |
| 5,300,398 | 4/1994 | Kasczuk | 430/201 |
| 5,318,941 | 6/1994 | Ohshima et al. | 503/227 |
| 5,401,606 | 3/1995 | Reardon et al. | 430/200 |

FOREIGN PATENT DOCUMENTS

| | | |
|---|---|---|
| 0452566A1 | 10/1991 | European Pat. Off. . |
| 0529929A1 | 3/1993 | European Pat. Off. . |

OTHER PUBLICATIONS

International Application Published under the PCT on Oct. 3, 1991 as Publication No. WO 91/14581, Guittard.
"Transformations," Candela, Ltd., Summer, 1992. p. 2.

*Primary Examiner*—Richard L. Schilling
*Attorney, Agent, or Firm*—Gary L. Griswold; Walter N. Kirn; Mark A. Litman

[57] ABSTRACT

A thermal mass transfer imaging process comprises the thermal mass transfer of a dye-receptive transparent donor layer which is then at least partially over-coated with a thermally transferred dye image.

7 Claims, No Drawings

PROCESS FOR APPLYING IMAGES TO NON-ADHESIVE SURFACES IN THERMAL DYE TRANSFER IMAGING

BACKGROUND OF THE INVENTION

1. Field of the Invention

The present invention relates to both thermal mass transfer processes and thermal dye transfer imaging. In particular the present invention relates to the use of a first thermal mass transfer coating on a substrate which may be mass transferred to essentially any receptor surface to provide an image-wise distributed background layer on the receptor surface having desirable dye receptivity to a subsequently thermally transferred dye. Non-imaged areas still retain the touch and appearance of the original, uncoated receptor surface. A computer program integrates color separation information into data to drive a thermal printer to deposit the thermal mass transfer coating onto substantially only those areas where the subsequent colors are to be deposited.

2. Background of the Invention

Thermal mass transfer and thermal dye transfer processes are technologies that bear some superficial similarities but which are distinct within the technical art. Both processes use a donor sheet and a receptor sheet. The thermal mass transfer donor sheet normally comprises a carrier layer with at least a thermally transferable colorant (a dye or preferably a pigment) in a heat softenable binder. The thermal dye transfer donor sheet comprises a carrier layer with at least a dye layer on the donor surface. The dye layer may consist of only dye or dye in a binder (the binder not transferring when the dye is thermally transferred). Both transfer sheets are used with the donor surface in intimate contact with a receptor material, and the donor sheet is heated in an imagewise manner (e.g., by thermal printheads, irradiation as by a laser or high intensity radiation transmitted through a mask or stencil) to transfer the image forming material. In the thermal mass transfer system, the donor layer is softened by the imagewise heating (and sometimes a receptor layer on the receptor sheet is contemporaneously softened), and the softened area is transferred to the receptor sheet. In thermal dye transfer, the dye is melted, sublimated, dissolved or vaporized to diffusively transfer to the receptor sheet and tends to be adsorbed and/or absorbed into the surface of the receptor element. The nature of the mechanism of adherence of the transferred image to the receptor sheet makes the nature of the surface of that receptor sheet important for each of the imaging processes. Surfaces which work well for receiving mass transfer images do not necessarily work well for thermal dye transfer. Furthermore, there are not many natural surfaces which can function as a high quality dye receptive surface.

U.S. Pat. No. 4,472,479 (Hayes et al.) describes a light barrier fluorescent ribbon for impact printing which comprises a carrier layer, and on one surface of the carrier layer a binder layer of wax or polymeric resin and fluorescent dye, and a barrier pigment within that layer or in a separate layer. The barrier pigment is a finely divided pigment of lustre-affecting reflective material (metal or metal appearing) which provides color toning of the fluorescent image.

Japanese Published patent application (Kokai) 1-258,990 discloses non-digital transfer donor sheets coated with heat meltable ink layer regions of 3 primary colors or 4 primary colors plus black and a region containing a fluorescent dye. Overprinting of the respective regions with fluorescent dye is disclosed. The dye image is formed by printing onto one sheet and then transferring the entire image.

Japanese Published patent application (Kokai) 63-281,890 discloses a recording material having a thermo-fusible ink layer containing a fluorescent compound and a thermo-fusible ink layer containing colorant and a thermo-fusible ink layer containing an extender with hiding power.

U.S. Pat. 3,647,503 describes a multicolored heat transfer sheet in which colored layers are sequentially coated on a substrate. That patent is directed at multicolored transfer imaging and requires good porosity of the uppermost layer to provide good transfer of dye from lower layers.

There is a need in the art, particularly in the proofing industry, to be able to apply dye images to many different substrates without losing the clarity of the image and without having to use complex processes. U.S. Pat. Nos. 4,923,848 and 5,077,263 disclose thermal dye processes in which the dye is first transferred onto a temporary receptor having a thermally laminable, dye-receptive, strippable layer on the surface of the temporary receptor. The strippable layer is transferred, along with the dye image to a final receptor surface. This process requires at least two imaging steps and two different types of imaging apparatus (the thermal dye imager and the laminator). There could be a polymer coating on top of the whole receptor substrate changing the substrate's appearance in the background areas.

U.S. Pat. No. 5,116,148 describes a thermal transfer sheet and a process of using it. The transfer sheet has dye transferable media and a precoating layer in separate areas. The precoating layer is laminated and transferred to a receptor sheet in advance of the dye transfer. There is no indication that the precoating layer is thermally mass transferable in an imagewise manner, and no imagewise transfer process is shown, although it is disclosed that the precoating layer can be formed only at the necessary parts on the recording sheet. Furthermore, in order to print properly according to their process, adhesion preventing layers have to be provided over the ink layer region and between the transferable dye receptive layer (precoating layer) and the donor substrate.

EPO Patent Application Serial No. 94.401594.0 overcomes deficiencies of the prior art in providing good quality thermal dye transfer images that are generated by thermal transfer onto thermal mass transfer deposited backgrounds. The clarity and variety of thermal dye transfer images produced by this method is improved by image-wise thermal mass transferring a clear (translucent to transparent, and uncolored) layer prior to dye transfer.

BRIEF DESCRIPTION OF THE INVENTION

The present invention describes a thermal transfer process for providing a thermal dye transfer image which comprises the steps of overlaying data from at least two different color separation images to generate a composite image data for the thermal mass transfer of a clear, translucent, transparent or opaque dye and/or mass transfer receptive layer comprising placing a thermal mass transfer donor element having said dye and/or thermal mass transfer receptive mass transfer donor layer on one surface in contact with a second surface, transferring at least a portion of said receptive thermal mass transfer donor layer in the form of said composite image to said second surface by heating at least a portion of said thermal mass transfer donor layer, and subsequently thermally transferring dye or thermal mass transfer colorant onto said at least a portion of said thermal mass transferred donor layer, said thermal mass transferred layer comprising a dye receptive, clear to opaque, thermoplastic binder. If the substrate onto which the receptive image is transferred is strippable from said receptive image, the dye bearing thermal dye or mass transferred image may be heat-pressure retransferred to a final receptor sheet. The layer may actually comprise two layers, the lowermost layer (adjacent the carrier layer) being a mass or dye-receptive layer and the uppermost layer (with respect to the carrier) is a thermoplastic layer which need not comprise a dye receptive binder, but is itself clear (defined as transparent or translucent) or opaque or toned or metallic. The receptive, imagewise distributed layer containing the thermal mass transfer or dye receptive binder is referred to herein as a mass-transferable and dye/mass transfer-receptive layer (e.g., MAD layer).

By dye/mass transfer receptive, it is meant that the MAD layer, after being thermally mass transferred to a receptor, possesses the properties of a good thermal dye or thermal mass transfer receptor coating. It would (a) receive thermally transferred dyes or thermal mass from dye donors using the same thermal printer to yield high optical densities, high gradation, good uniformity images, (b) not cause thermal mass transfer of the dye/thermal mass donor colorant coating during thermal dye transfer and (c) not result in reverse transfer of the MAD binder from the receptor to the dye donors during thermal dye/thermal mass transfer.

The coating thickness of the MAD layer is preferably from 1 m to 10 m, more preferably, from 2 m to 8 m and most preferably from 3 m to 6 m. The MAD layer has a softening or melting temperature between 50° C. and 120° C., preferably from 60° C. and 110° C., more preferably from 65° C. and 100° C. and most preferably from 70° C. and 90° C.

Dye receptive and thermal mass transfer receptive are understood in the art. They often can be expressed with a range and quality of properties. It is usually more oleophilic than hydrophilic (for the thermal mass transfer receptive MAD layer, in the case of the thermal mass transfer color binder being oleophilic). For the dye receptive MAD layer, dye receptive is often described as being accepting of dyes into the bulk of the coating by a migration or transfer of the dye into the bulk when the surface of the receptive layer is heated. It is theorized that the softening of the polymer opens up available space between polymer chains to accept dye. It is desirable that the dye receptivity be inclusive of anthraquinone, azo, sulfone, and other sublimable dyes used in the art of thermal dye transfer be particularly capable of absorption into the bulk of the polymer at 100–150° C.

DETAILED DESCRIPTION OF THE INVENTION

It is a feature of the invention to provide high quality thermal dye transfer images by first thermally mass transferring a light transmitting background layer in an image pattern corresponding to a composite color separation image formed from the combining of gray scale digital or analog information for at least two different colors for a subsequently provided thermal dye/mass transfer image. This is especially useful when the image is placed on top of a surface in which it is desired to see the background and/or which is a poorly dye-receptive background. Where substrates are transparent or there is some particular desire for the substrate not to be seen through the dye/mass transfer color images (which may be partially transparent), the use of an opaque MAD layer, especially an opaque white or neutral colored MAD layer is particularly desirable. The thermal transfer donor ribbons of the invention are suitable for imaging applications in desktop publishing, direct digital non-critical color proofing, and short-run sign manufacture, for example.

In one aspect the invention uses a thermal mass transfer donor ribbon comprising a substrate coated on at least a portion thereof with a MAD layer. Another portion of the donor sheet or donor ribbon may have coated thereon dye or mass transferable materials of different colors, whether conventional (e.g., cyan, magenta, yellow, black, red, green, or blue) or more exotic or tailored colors (e.g., an opaque white, orange, fluorescent dye, pigments or metallic background ink layer).

In yet another aspect the invention discloses a process for transfer imaging wherein three layers of material, a MAD layer and then at least two dye/mass transfer images, are thermally transferred in successive steps to a receptor film, wherein the resulting thermally transferred MAD image (which is discontinuous, not covering 100% of the surface of the final or temporary receptor surface) is at least 90% of its surface area (preferably at least 95% of its surface area) covered by said at least two dye/mass transfer images (that is, it is on the interior surface of the thermal transfer image on the final receptor).

In a further aspect the invention discloses a process for transfer imaging comprising the steps of combining the color separation data of at least two different color separation images to form a MAD layer composite image data, then image-wise thermally mass transferring a MAD, background layer from a donor ribbon to a receptor sheet (e.g., of film or paper) thereby creating a thermal mass/dye-receptive background latent image corresponding to the composite image data, and then thermally transferring dyes/mass from multiple (e.g., said at least 2, whether they be 2, 3 or 4) patch dye/mass donor layers from said donor ribbon or another donor element onto said clear, mass/dye-receptive background latent image.

In another aspect, the invention discloses a process for transfer imaging comprising the steps of image-wise (in the image of the composite image data described above) thermally mass transferring a MAD background layer from a donor ribbon to an intermediate polymeric film receptor sheet thereby creating a mass/dye-receptive background latent image, then thermally transferring mass or dyes from multiple patch dye or mass donor layers from a ribbon or another donor element onto said receptive background latent image, and then heat-pressure transferring the dye/mass bearing MAD image from the intermediate film receptor to a final receptor sheet (e.g., of film or paper).

The thermal transfer donor ribbon constructions useful in the practice of the present invention comprise a thermally mass transferable layer comprising or consisting essentially of a mass/dye-receptive, thermally transferable layer (polymer/wax/solid particulates) coated onto a thermal donor substrate.

According to one embodiment of the present invention, the mass/dye-receptive thermal mass transfer donor ribbons of the present invention comprise a substrate having coated on at least a portion thereof an ink layer, wherein said mass/dye-receptive thermally mass transferable layer comprises a thermoplastic mass/dye receptive binder. The term "mass/dye receptive binder" is well understood in the art and indicates that the binder is capable of receiving good image densities from a thermally transferred dye or mass transfer colorant layer. Although the mechanism for achieving good dye reception is not well understood, there is a belief that the polymer 'loosens' upon heating, opening up space between polymer chains. The dye is believed to move into these spaces through diffusion or sublimation so as to be retained in the receptive polymer. The materials are ordinarily oleophilic (hydrophobic) polymeric resins having a thermal softening point between 35 and 120 degrees Celsius.

The separate mass/dye-receptive binder layer releases from the carrier during mass transfer imaging and becomes the outermost layer on the imagewise transferred mass transfer image. By selecting the appropriate binder dissolved or dispersed in the solvent, any appropriate dye receptive polymer may be coated onto the donor element.

Preferably, the MAD layers are prepared by coating a solution (or a dispersion) of the binder solution/dispersion onto a carrier layer. The clarity of the clear form of the mass/dye-receptive coating should be such that at a coating thickness of 10 micrometers it has an optical density of less than 0.2, preferably less than 0.1, and most preferably less than 0.05. The binder for the thermally mass transferable MAD layers preferably comprises at least one of a wax-like substance 0.01 to 5 micrometer solid particulate (preferably optically clear) and a polymeric resin. Opaque mass transferable MAD layers should be able to provide an optical reflection density of at least 1.0, with no upper limit being undesirable. Intermediate values of optical density in the MAD layer may well be desirable for toning images or providing metallic appearances.

Suitable wax-like substances have a melting point or softening point of from about 35° to 140° C., and include but are not limited to higher fatty acid ethanolamines such as stearic acid monoethanolamide, lauric acid monoethanolamide, coconut oil monoethanolamide; higher fatty acid esters such as sorbitan behenic acid ester; glycerine higher fatty acid esters such as glycerine monostearic acid ester; acylated sorbitols such as acetylsorbitol and benzoylsorbitol, acylated mannitols such as acetylmannitol; and waxes such as beeswax, paraffin wax, carnauba wax, crystalline waxes, synthetic candelilla waxes, ChlorezÔ waxes, etc.; and mixtures thereof. Preferred wax-like materials include stearic acid monoethanolamide (mp 91°–95° C.), lauric acid monoethanolamide (mp 80°–84° C.), coconut oil fatty acid monoethanolamide (mp 67°–71° C.), sorbitan behenic acid ester (mp 68.5° C.), sorbitan stearic acid ester (mp 51° C.), glycerine monostearic acid ester (mp 63°–68° C.), acetyl sorbitol (mp 99.5° C.), benzoyl sorbitol (mp 129° C.), and acetyl mannitol (mp 119°–120° C.).

Suitable polymeric resins have melting or softening points in the range of about 20° to 180° C., preferably in the range of 40° to 140° C., more preferably in the range of 55° to 120° C., and most preferably in the range of 60° to 100° C. and include, but are not limited to, polycaprolactone, polyethylene glycols, aromatic sulfonamide resins, acrylic resins, polyamide resins, polyvinyl chloride and chlorinated polyvinyl chloride resins, vinyl chloride-vinyl acetate copolymers, alkyd resins, urea resins, melamine resins, polyolefins, benzoguanamine resins and copolycondensates or copolymers of the above resin materials. Preferred polymeric resins are polycaprolactones having an average molecular weight of 10,000 g/mol (mp 60°–65° C.), polyethylene glycols having an average molecular weight of 6000 g/mol (mp ~62° C.), low condensation polymerized melamine toluenesulfonamide resins (sp ~105° C.), low condensation polymerized benzyltoluene sulfonamide resins (sp ~68° C.), acrylic resins (sp ~85° C.), and linear polyamide resins (sp ~60° C.). The terms "mp" and "sp" refer to "melting point" and "softening point," respectively.

Suitable micron sized solid particulates for the thermal mass transfer donor element may be any clear fine solid particles that are not soluble and yet easily dispersible in the solvent used to make up the solution/dispersion. Most preferred particulates such as $SiO_2$, micas, polyethylene powders etc., are those with high differentials in their thermal expansion coefficients and low differentials in their indices of refraction from those polymeric/wax binders. The first property is preferred for higher dye receptivity during imaging because more spaces are opened up when the MAD layer is at an elevated temperature. The second property is preferred for index matching in order to reduce the light scattering in the MAD layer. Other preferred solid particulates include but are not limited to $TiO_2$, MgO, ZnO, $CaCO_3$, etc.

The wax, or wax-like material, assists in having the transferred image conform to a rough receptor surface, such as paper. The combination of wax material and particulates provides the unexpected benefit of reducing or eliminating adhesion of the donor sheet to the receptor sheet during the transfer process. It is preferred that the relative coefficients of thermal expansion between the polymers and particulate in the MAD composition differs by at least 10 and preferably by at least $10^2$. The composition can comprise, for example, 5 to 30% by weight particulates and 95 to 70% by binder (wax material and polymer). The binder usually comprises 70–95% wax and 30–5% by weight polymers). Overall the MAD layers may comprise 5 to 30% particulates, 50 to 90% wax and, 3 to 28% polymer.

Preferably, the thermal mass transfer MAD layers have a melting point (mp) or softening point (sp) of 50°–140° C. to enhance the thermal transferring property.

Suitable substrate materials for the thermal mass transfer donor element may be any flexible material to which a MAD transparent or opaque white/metallic pigment ink layer may be adhered. Suitable substrates may be smooth or rough, transparent, opaque, and continuous or sheet-like. They may be essentially non-porous. Preferred backings are transparent or white-filled or transparent polyethylene terephthalate or opaque paper. Non-limiting examples of materials that are suitable for use as a substrate include glass, metals, metallic coated film, polyesters (especially polyethylene terephthalate, polyethylene naphthalate), polysulfones, polystyrenes, polycarbonates, polyimides, polyamides, cellulose esters, such as cellulose acetate and cellulose butyrate, polyvinyl chlorides and derivatives, etc. The substrate generally has a thickness of 1 to 500 mm, preferably 2 to 100 mm, more preferably 3 to 10 mm when they are polymeric film, but the thickness is of no import (particularly when the image is transferred from an intermediate sheet) when the glass, metal, or metal coated substrates are used.

By "non-porous" in the description of the invention it is meant that ink, paints and other liquid coloring media will not readily flow through the substrate (e.g., less than 0.05 ml per second at 7 torr applied vacuum, preferably less than 0.02 ml per second at 7 torr applied vacuum). The lack of significant porosity prevents absorption of the heated receptor layer into the substrate.

Suitable substrate materials for the intermediate receptor in the heat-pressure retransfer process may by and large be similar to those suitable for the thermal transfer donor element described earlier. However, in order to retain registrations through the successive thermal mass and thermal dye transfers, the substrate generally has a thickness of 0.5 to 7 mil, preferably 1 to 4.5 mil and most preferably 1 to 3 mil.

In another embodiment of the present invention thermal mass transfer ribbons are prepared by coating a mass/dye receptive thermal transfer layer onto one side of a suitable substrate in a pattern such that the MAD layer and at least one thermal dye transfer layer are interspersed in a manner so that the area of the substrate covered by each ink layer is approximately equal. An area of thermal mass transfer material may also appear on the same ribbon or sheet. The background and the dye image may be identical (coextensive in all direction), substantially overlap (e.g., the dye-receptive layer covering more area, less area or the same area as the dye image, but not in identical register), completely overlap, or outline one another. To get the benefits of the present invention, at least some portion of the dye image must be deposited onto the transferred MAD layer.

The thermal transfer ribbons of the present invention are generally employed in combination with a receptor sheet in a process for transfer imaging wherein at least two layers of material, a MAD layer and at least one thermal mass/dye transfer layer, are imagewise transferred in sequential steps. The MAD layer is transferred separately from any dye image layer.

The thermal transfer donor ribbons of the invention are suitable for image production in desktop publishing, direct digital non-critical color proofing, short run sign manufacture, and so forth, especially for graphics desiring unusual color generation.

There is a unique aspect to the use of image data in the practice of the present invention. The digital information in the cyan, magenta, yellow and black (or any other colors that are used in the image) is overlaid to generate an image. The shadow image comprises the sum of all surface areas where any optical density is to be represented in the final image by thermal transfer of material. The shadow image has no concern for the specific color to be deposited over it, because it is in effect to be a deposited receptive area which is transferred only in those areas where the visible image is to be transferred, leaving the receptor surface free of MAD material where no visible image is to be deposited (e.g., all areas where at least one of C, M, Y and K are to be deposited) where the visible image is to be deposited. Therefore the MAD layer is transferred in an image-wise manner corresponding to the shadow image of the visible image.

Coating of the thermally mass transferable layers on the donor sheets may be accomplished by many standard web coating techniques such as imprint gravure, single or double slot extrusion coating, and the like. Imprint gravure is particularly useful for patch-type coatings in which there are interspersed regions of opaque white or metal colorants on a ribbon or sheet. MAD layer coating thicknesses useful in the present invention are 0.1 to 50 micrometer, preferably 0.5 to 10 micrometers most preferably 1 to 6 micrometers.

The donor ribbons of the present invention are generally used in thermal printing by contacting the transferable layer of the donor ribbon with a receptor sheet or film such that at least one thermally transferable donor layer is in contact with the receptor sheet. Heat is applied, either from a thermal stylus or an infrared heat source such as an infrared laser or a heat lamp and the donor layer is transferred to the receptor. The heat may be applied to the back of either the donor ribbon or receptor sheet or may be directly introduced to a transferable donor layer.

Conventional commercial receptor sheet materials may also be used as the receptor and include Dai Nippon Type I and Type V receptor films (Dai Nippon Insatsu K. K., Tokyo, Japan), Dupont 4-CastÔ receptor film (E. I. Dupont de Nemours Co., Wilmington, Del.), Scotchcal film (3M Co., St. Paul, Minn.), 3M RainbowÔ transparency, 3M RainbowÔ ABR receptor and polyethylene terephthalate. The receptor sheets may be colored, that is they may have an optical density of at least 0.2 in the visible region of the electromagnetic spectrum.

Computer Function to Combine Images

The operation of the computer to combine the at least two color separation images to form the composite data MAD layer image data is by adding all 'gray' areas from the at least two color separations, as by a software program as presented below:

```
#include <stdio.h> #include <math.h>
#define NAMELEN 20
int rw,cm; main () {
    int i, j, temp1, temp2, temp3, temp4, temp ;
    char infile[NAMELEN], outfile[NAMELEN] ;
    unsigned char *inimag, *outimag;
    FILE *fdo1, *fin;
    printf("filename") ;scanf ("%s", infile) ;
    printf("CM      ") ;scanf ("%d", &cm) ;
    printf("Rw      ") ;scanf ("%d", &rw) ;
    printf("filename") ;scanf ("%s", outfile) ;
    inimag= (unsigned char *) malloc (cm*rw*4*sizeof(char)) ;
    outimag= (unsigned char *) malloc (cm*rw*4*sizeof(char)) ;
    fin=fopen(infile, "r") ;
    fdo1=fopen(outfile, "w") ;
    fread(inimag,sizeof(char), cm*rw*4, fin) ;
    printf("read done") ;
    for (i=0, i<rw;++i) {
        for(j=0;j<cm;++j) {
        printf("pixel %d %d ",i,j) ;
    *(outimag+cm*i+(cm−1−j))=*(inimag+(rw*cm)+cm*i+j) ;
    *(outimag+(rw*cm)+cm*i+(cm−1−j))=*(inimag+rw*cm*2)+cm*i+j) ;
    *(outimag+(rw*cm*3)+cm*i+(cm−1−j))=*(inimag+cm*i+j) ;
    temp1 = *(inimag+(rw*cm)+cm*i+j) ; /*magenta*/
    temp2 = *(inimag+(rw*cm*2)+cm*i+j) ; /*yellow*/
    temp3 = *(inimag+(rw*cm*3)+cm*i+j) ; /*black */
    temp4 = *(inimag+cm*i+j) ; /*cyan */
    temp=1020−temp1−temp2−temp3−temp4 ;
    printf("y= %d m= %d c= %d k=
    %d\n",temp2,temp1,temp4,temp3) ;
    if(temp==0) {
    *(outimag+(rw*cm*2)+cm*i+(cm−1−j))= 225;
    }
    *(outimag+(rw*cm*2)+cm*i+(cm−1−))= 0;
    }
    }
    fwrite(outimag,sizeof(char),cm*rw*4,fdo1) ;
    fclose(fin),fclose(fdo1) ;
    }
    print
```

The basic function of the software is to take digital or analog data of the individual color pages (of data), combine (overlay) the data to produce a new page of data for directing the printer to deposit a MAD layer approximating or at least coextensive with the total area to be printed in color or opacity. Other features can also be added in the software.

In a preferred embodiment a release coating is applied to the back side of the donor ribbon (i.e., the side opposite the thermally transferable donor layer(s)) to improve handling characteristics of the ribbon and reduce friction. Suitable release materials include, but are not limited to, silicone materials including poly(lower alkyl)siloxanes such as polydimethylsiloxane and silicone-urea copolymers, and perfluorinated compounds such as perfluoropolyethers.

The following examples further illustrate practice of the present invention and should not be considered limiting.

I. The following experiments demonstrate the feasibility of the concept through the use of experimental printers.
*Basic solutions/emulsions/dispersions;

A. Wax Emulsion I: A 5–10% solids wax-polymer emulsion in toluene was prepared as follows: First, a clear, 5% solids solution of the wax-polymer with the ingredients: Chlorowax 70/Shellwax 700/Acryloid B82/Carnauba Wax/ Synthetic Candelilla/Staybelite Ester 10/Elvax 210, 1.25/ 1.67/0.1/2.5/1.0/0.05/0.6, was prepared at an elevated temperature of ~70° C. Then a small amount (2–5% based on the solids content of the solution) of charging/dispersing agent, Zirconium Hex-Cem, was added to the solution. The solution was then brought back to room temperature under high speed agitation and a stable emulsion was obtained.

A1. Wax Emulsion II: Same as A except the charging/ dispersing agent, Zirconium Hex-Cem was replaced by a OLOA 1200 in order to further stabilize the final dispersion.

A2. Wax Emulsion III: Same as A1 except the charging/ dispersing agent, OLOA, was replaced by a 9/1 mixture by weight of OLOA/Witflow 950 (witco) in order to reduce the viscosity of the emulsion.

B. Hydrophobic $SiO_2$, TS610 (Cabot), was dispersed in Acryoid B99 at 1/1 ratio and a solids content of 10% in toluene. A small amount (1–5% based on the solids content of the solution) of charging/dispersing agent, OLOA, was added to the solution. This mixture was then either sonicated or ball milled until it became a clear dispersion.

B1. Hydrophobic $SiO_2$ dispersion II: Same as B except the Acryloid B99 was replaced with Acryloid B82.

C. Acrylic Solution: Elvacite 2044 was dissolved in toluene to make a 10% solids clear solution.

D. Acrylic Solution: Acryloid C10LV was dissolved in toluene to make a 10% solids clear solution.

E. Acrylic Solution: Acryloid B82 was dissolved in toluene to make a 10% solids clear solution.

F. Vinyl Acetate Solution: DesographÔ E337 was dissolved in toluene to make a 10% solids clear solution.

G. Acrylic Solution: DesographÔ E327 was dissolved in toluene to make a 10% solids clear solution.

H. Vinyl Solution: Elvax 210 (DuPont) was dissolved in toluene to make a 10% solids clear solution.

(I). Direct thermal dye transfer process

1. A coating dispersion was prepared by mixing 50 parts of A* (7.5% solids), 1 part B, 10 parts of D, 10 parts E, and 6.2 parts of toluene. The resultant dispersion was ~7.5% solids. A #24 Meyer rod was used to coat the dispersion on a 6 micron PET substrate. After air drying, the coated substrate was then oven dried at 80° C for 1 minute, resulting in the final MAD donor.

a). Demonstration of the concept using a Model II 200 dpi thermal printer.

Thermal mass transfer of the clear MAD layer to a piece of Calcomp thermal mass transfer paper was carried out at 19 volts (~3.4 J/cm$^2$). Good complete transfer was obtained both in the solid and the alphanumerical areas. Resolution (>200 dpi) was limited by the resolution of the printer. A piece of Dainippon magenta dye donor was used to thermal dye transfer on top of the clear image at 20 volts. On the solid area, a uniform and high density magenta image with good resolution (>200 dpi) was obtained. The ROD was measured to be ~0.4. No dye donor mass transfer was observed.

b). Demonstration of the concept using a Model III 200 dpi thermal dye printer.

In this experiment, a monochrome 3M image was chosen for mass transferring the clear MAD layer and a tricolor image, Pinky, for thermal dye transfer. The same receptor as in 1a) was used. A dye receptive clear image was transferred at 10.75 V (~9.4 J/cm$^2$) and the YMC dyes were transferred at 9.5 V(~7.4 J/cm$^2$). A good continuous toned color dye image was obtained on the clear 3M image area. No dye transfer was observed on the plain thermal paper areas. The non-uniformity due to paper fiber was clearly shown.

(II). Indirect thermal dye transfer process

1. A coating dispersion was prepared by mixing 1 part of C, 2 parts of B, and 8 parts of A. The resultant dispersion was 6.4% solids. A #40 Meyer bar was used to coat the dispersion on a 6 micron PET substrate. After air drying, the coated substrate was then oven dried at 80° C. for 1 minute, resulting in the final MAD donor. The dry thickness of the MAD is ~3.5 microns.

a). Demonstration of the concept using Model II 200 dpi thermal printer. (Model II has 32 grey level capability. It can only do solid patch and alphanumerical printing up to 3.8 J/cm$^2$ energy output.)

Thermal mass transfer of the clear MAD layer to a piece of 1 mil plain PET film, used as an intermediate image carrier was carried out at 19 volts (~3.4 J/cm$^2$). Good complete transfer was obtained both in the solid and the alphanumerical areas. Resolution (>200 dpi) was limited by the resolution of the printer. Dainippon cyan and magenta dye donors were used to thermal dye transfer on top of the clear image at 20 volts. On the solid area, a uniform and high density dye image with good resolution (>200 dpi) was obtained. No dye donor mass transfer was observed. The ROD was measured to be ~0.7 for magenta color. This compares with an ROD of ~1.0 for direct dye transfer to a 3M RainbowÔ dye receptor under the same conditions.

A 3M Model 1147 film laminator used in Matchprint application was used for the final heat and pressure transfer of the dye image bearing MAD layer on the intermediate carrier to a final printing paper. The temperature of lamination was set at a comfortable 260° F. Three different paper substrates were chosen for demonstration; a plain paper used for an office copier, a Calcomp thermal paper, and a matchprint transfer base.

A complete transfer of the dye image bearing MAD layer from the intermediate carrier was obtained for both the Calcomp thermal paper and Matchprint base. However, severely incomplete transfer was observed for the plain paper. After increasing the dry thickness of the MAD to ~6 microns by using a higher concentration dispersion/emulsion, complete transfer was obtained even for the copier paper.

b). Demonstration of the concept using Model III 200 dpi thermal dye printer. (Model III has 128 grey level capability. It is capable of graphics printing up to ~16 J/cm$^2$ energy output).

In this experiment, a monochrome 3M image was chosen for mass transferring the dye receptive clear layer and a YMC tri-color image, Pinky, for thermal dye transfer. The same 1 mil plain PET as in 1a) was used as the intermediate carrier. MAD image was transferred at 11 V (~9.8 J/cm$^2$) and the color dye images were transferred at 12 V(~11.8 J/cm$^2$) in a reversed order of CMY. A beautiful continuous toned color dye image was obtained only on the clear MAD image area. A reversed order of color dye printing is necessary in order to compensate for the mirror image resulting from the subsequent heat and pressure transfer to the final paper substrate. In actual printing, the electronic images also have to be converted to their mirror images before sending to the printer.

The heat and pressure transfer to a Calcomp thermal paper was carried out in the same manner as described earlier. A complete, high quality, continuous toned image simulating a real screen printing was obtained on the thermal paper.

2. A coating dispersion was prepared by mixing 1 part of G, 1 part of B, and 8 parts of A. The resultant dispersion was 6% solids. A #40 Meyer bar was used to coat the dispersion on a 6 micron PET substrate. After air drying, the coated substrate was then oven dried at 80° C. for 1 minute resulting in the final MAD donor. The dry thickness of the MAD layer is ~3 microns.

a). Demonstration using Model II 200 dpi thermal printer.

Thermal mass transfer of the clear MAD layer to a piece of 1 mil plain PET film, used as an intermediate image carrier was carried out at 19 volts (~3.4 J/cm$^2$). Good complete transfer was obtained both in the solid and the alphanumerical areas. Resolution (>200 dpi) was limited by the resolution of the printer. Dainippon cyan dye donors were used to thermal dye transfer on top of the clear image at 20 volts. On the solid area, a uniform and high density dye image with good resolution (>200 dpi) was obtained. No dye donor mass transfer was observed. The ROD was measured to be ~1.48. This compares with a ROD of ~1.72 for direct dye transfer to a 3M dye receptor under the same conditions.

A complete transfer of the dye image bearing MAD layer from the intermediate carrier to the Calcomp thermal paper was obtained.

b). Demonstration using Model III 200 dpi thermal dye printer.

Similar procedure as in example II, 1b) has been carried out using the new MAD donor. A complete, high quality, continuous toned dye image simulating a real screen printing was obtained on the thermal paper.

3. Other MAD formulations have been tried: (D/B/A, 1/2.5/10, 3 and 6 microns) and (F/B/A, 1/2.5/10,3 and 6 microns). All have good final transfers to the Calcomp thermal paper. However, all have incomplete transfer to the copier paper. Another MAD formulation that gave good transfer to a copier paper was (E/B/A, 1/2.5/10, 6 microns).

II. The following examples were demonstrated through the use of a 3M Rainbow Ô thermal printer.

Before printing, a patch of MAD donor ribbon was properly spliced on a regular YMCK ribbon between the K patch and the Y patch. A prompt mark to initiate printing was placed at the beginning of the spliced MAD layer patch.

In order to generate a full colored image with appropriate fonts and text on a printing paper using a current, commercially available 3M Rainbow Ô printer, the "shadow" image data file X described earlier in the text is first generated from the CMYK data files of the image using any conventional computer software program which can provide color separation information. Since the current version of Rainbow Ô printer is capable of printing only four separations without losing the registration, Y'M'C' files (generated after the inverse under color removal operations have been applied to YMC) are chosen for printing in addition to the X file. The XY'M'C' files are then saved as a new image in CMYK, for example, in Adobe Photoshop Ô format.

After the proper receptor and the spliced donor ribbon were placed in the Rainbow printer, the image was then opened in the 3M Rainbow Ô Color Proofer software program, RIP processed and printed.

Both the "direct" press paper thermal dye transfer (i.e. no intermediate receptor and subsequent heat and pressure re-transfer) and the indirect press paper thermal dye transfer have been tested and have been working properly like they are intended to perform.

For the examples here, the MAD layer that gave the best result for the "direct" print is a 5 micron thick layer of 0.75/2/4, Elvax 210/(TS610/B99, 1/1)/Wax emulsion II coated on a 4.5 micron TR101 ribbon. For "indirect" print, a ratio of 1/2/4 seemed to give the best results. The intermediate used in the "indirect" print is a 1 mil plain PET film. A 3M Matchprint Ô model 1147 laminator was used to heat-pressure re-transfer the image to a final paper receptor. Currently, we have focused only on printing to smooth paper receptors, such as 3M Brand Type 180 plotter paper, Calcomp thermal paper, the "backing" paper of the 3M Rainbow Ô dye recepting transparency etc.

The program to be used for actual application after the introduction of Rainbow Ô II printer will be simpler. It will only need to generate the X file (or the mirror-inverted X file) from the CMYK file of the original image and can be easily obtained through a simple modification of the current software. The actual printing involves the swapping of the continuous coated MAD ribbon cartridge and the regular YMCK ribbon cartridge during imaging.

Additional special features may be readily added to the software to effect features in the printed image. For example, underlayers (e.g., a white or metallic underlayer) may be subjected to extend or expand a defined distance beyond the boundaries of the combined data of the overlaid image. This would create a highlight, boundary, or border around objects in the image or the entire image. Another simple image effect could be to split the image into lines and interleave a white background between the lines for an artistic effect. It is important to note that the MAD layer can be, and often is, printed over less than 100% of the surface onto which the image is to be printed. This can desirably leave transparent areas between areas where the MAD layer and overlaid image is deposited. It is possible for less than 95% of the area circumscribed by the image to be without a MAD layer. The lower the percentage of area actually containing image density, less than 90%, less than 80%, or even less than 50% of the area within the boundaries of the image needs to be covered with a MAD layer.

| MATERIALS AND VENDORS | |
| --- | --- |
| Material | Vendor |
| TS610 Hydrophobic SiO$_2$ | Cabot Co. (Tuscola, IL) |
| Acryloid B82, B99 | Rohm & Haas (Philadelphia, PA) |
| Elvacite 2014, 2044 | E. I. DuPont (Wilmington, DE) |
| Zirconium Hex-Cem | Mooney Chem., Inc. (CL., OH) |
| Elvax 210 | E. I. DuPont (Wilmington, DE) |
| Staybelite Ester 10 and EHEC X-high (ethyl cellulose) | Hercules, Inc. (Wilmington, DE) |

MATERIALS AND VENDORS

| Material | Vendor |
| --- | --- |
| Chlorowax 70 | Diamond Shamrock (CL., OH) |
| Shellwax 700 | Shell Chem., Co. (Houston, TX) |
| Carnauba Wax | Frank B. Ross Co. (Jersey City, NJ) |
| Synthetic Candelilla Wax | Frank B. Ross Co. (Jersey City, NJ) |
| OLOA 1200 | Chevron Chem., Co. (Rolling Meadows, IL) |
| Witflow 950 | Witco (Houston, TX) |

We claim:

1. A process for providing a mixed thermal mass transfer and thermal dye transfer image on a receptor surface comprising combining the gray scale information from at least two different color separation images to form data of a composite image, and then thermal mass transferring a thermal mass receptive or dye-receptive image onto a receptor surface, said thermal mass receptive or dye-receptive image corresponding to said composite image, and thermal dye transferring a dye or thermal mass containing a colorant on top of at least part of said thermal mass or dye-receptive image, wherein all areas of dye images and thermal mass transfer color images deposited on said composite image comprise 100% of the surface area of said composite image, and said composite image on a receptor surface is a discontinuous image.

2. The process of claim 1 wherein at least two color separation images corresponding to the color separation images whose gray scale information were combined are deposited onto said composite image.

3. The process of claim 1 wherein said at least two color separation images are three or four color separation images, and color separation information of said three or four color separation images were combined to form said composite image, and said three or four color separation images corresponding to the color separation images whose gray scale information were combined are deposited onto said composite image.

4. The process of claim 1 wherein a mass transfer or dye-receptive image is thermally mass transferred and said dye image is subsequently transferred onto at least a part of said receptive image.

5. The process of claim 1 wherein said transferring of said receptive image and said dye image are performed off the same ribbon or sheet in sequence.

6. A process for providing a mixed thermal mass transfer and thermal dye transfer image on a receptor surface comprising combining the gray scale information from at least two different color separation images to form data of a composite image, and then thermal mass transferring a thermal mass or dye-receptive image onto a receptor surface, said thermal mass or dye-receptive image corresponding to said composite image, and thermal dye transferring a dye or thermal mass containing a colorant on top of at least part of said thermal mass or dye-receptive image, wherein all areas of dye images and thermal mass transfer color images deposited on said composite image comprise at least 90% of the surface area of said composite image, wherein said at least two color separation images are three or four color separation images, and color separation information of said three or four color separation images were combined to form said composite image, and said three or four color separation images corresponding to the color separation images whose gray scale information were combined are deposited onto said composite image, wherein said composite image on a receptor surface is a discontinuous image, wherein said receptor serves only as an intermediate medium, and an opaque white image deposited as said composite image and said deposited at least two color separation images are simultaneously heat and pressure transferred to a final receptor.

7. The process of claim 6 wherein the said intermediate medium is a polymeric film.

* * * * *

UNITED STATES PATENT AND TRADEMARK OFFICE
CERTIFICATE OF CORRECTION

PATENT NO. : 5,593,803
DATED : January 14, 1997
INVENTOR(S) : Kim et al

It is certified that error appears in the above-identified patent and that said Letters Patent is hereby corrected as shown below:

Col. 5, line 39, "ChlorezÔ" should be --Chlorez$^{TM}$--.
Col. 8, line 1, "4-CastÔ" should be --4-Cast$^{TM}$--.
Col. 8, line 3, "RainbowÔ" should be --Rainbow$^{TM}$--.
Col. 8, lines 3-4, "RainbowÔ" should be --Rainbow$^{TM}$--.
Col. 8, line 33, "printf("pixel %d %d",i,j);" should be --printf("pixel %d %d\n", i,j);--.
Col. 8, line 43, "if(temp=0) {" should be --if(temp==0) {--.
Col. 8, line 45, "*(outimag+(rw*cm*2)+cm*i+(cm-1-))=0;" should be
--*(outimag+(rw*cm*2)+cm*i+(cm-1-j-))=0;--.
Col. 9, line 38, "DesographÔ" should be --Desograph$^{TM}$--.
Col. 9, line 40, "DesographÔ" should be --Desograph$^{TM}$--.
Col. 10, line 37, "RainbowÔ" should be --Rainbow$^{TM}$--.
Col. 11, line 53, "RainbowÔ" should be --Rainbow$^{TM}$--.
Col. 11, line 60, "RainbowÔ" should be --Rainbow$^{TM}$--.
Col. 11, line 64, "RainbowÔ" should be --Rainbow$^{TM}$--.

UNITED STATES PATENT AND TRADEMARK OFFICE
CERTIFICATE OF CORRECTION

PATENT NO.    : 5,593,803
DATED         : January 14, 1997
INVENTOR(S)   : Kim et al It is certified that error appears in the above-identified patent and that said Letters Patent is hereby corrected as shown below:

Col. 12, line 3, "Photoshop Ô" should be --Photoshop$^{TM}$--.
Col. 12, line 6, "Rainbow Ô" should be --Rainbow$^{TM}$--.
Col. 12, line 20, "Matchprint Ô" should be --Matchprint$^{TM}$--.
Col. 12, lines 24-25, "Rainbow Ô" should be --Rainbow$^{TM}$--.
Col. 12, line 27, "Rainbow Ô" should be --Rainbow$^{TM}$--.

Signed and Sealed this

Ninth Day of December, 1997

Attest:

BRUCE LEHMAN

*Attesting Officer*          Commissioner of Patents and Trademarks